US009830093B2

(12) United States Patent
Guo et al.

(10) Patent No.: US 9,830,093 B2
(45) Date of Patent: Nov. 28, 2017

(54) METHOD AND APPARATUS FOR IMPROVING IMMUNITY TO DEFECTS IN A NON-VOLATILE MEMORY

(71) Applicant: Intel Corporation, Santa Clara, CA (US)

(72) Inventors: Xin Guo, San Jose, CA (US); Feng Zhu, San Jose, CA (US); Yogesh B. Wakchaure, Folsom, CA (US); David J. Pelster, Longmont, CO (US)

(73) Assignee: Intel Corporation, Santa Clara, CA (US)

( * ) Notice: Subject to any disclaimer, the term of this patent is extended or adjusted under 35 U.S.C. 154(b) by 128 days.

(21) Appl. No.: 14/672,080

(22) Filed: Mar. 27, 2015

(65) Prior Publication Data

US 2016/0283143 A1    Sep. 29, 2016

(51) Int. Cl.
| | |
|---|---|
| *G06F 3/06* | (2006.01) |
| *G06F 12/10* | (2016.01) |
| *G06F 11/10* | (2006.01) |
| *G11C 11/00* | (2006.01) |
| *G11C 16/26* | (2006.01) |
| *G11C 29/52* | (2006.01) |
| *G11C 29/04* | (2006.01) |

(52) U.S. Cl.
CPC .......... *G06F 3/0619* (2013.01); *G06F 3/0655* (2013.01); *G06F 3/0688* (2013.01); *G06F 11/108* (2013.01); *G11C 11/005* (2013.01); *G11C 16/26* (2013.01); *G11C 29/52* (2013.01); *G11C 2029/0411* (2013.01)

(58) Field of Classification Search
CPC .... G06F 3/0619; G06F 3/0688; G06F 3/0655; G06F 11/108; G11C 14/0009
USPC .................................... 711/103, 114
See application file for complete search history.

(56) References Cited

U.S. PATENT DOCUMENTS

| | | | |
|---|---|---|---|
| 6,563,816 B1 | 5/2003 | Nodoushani et al. | |
| 7,554,983 B1 | 6/2009 | Muppala | |
| 8,225,181 B2 | 7/2012 | Perlmutter et al. | |
| 8,291,161 B2 | 10/2012 | Byrne et al. | |
| 8,341,332 B2 * | 12/2012 | Ma ....................... | G06F 3/0613 711/103 |
| 8,751,898 B2 | 6/2014 | Bybell | |
| 9,208,018 B1 * | 12/2015 | Northcott ............ | G06F 11/1008 |

(Continued)

OTHER PUBLICATIONS

International Search Report and Written Opinion received for International Application No. PCT/US2016/018515, dated May 31, 2016, 11 pages.

(Continued)

*Primary Examiner* — Pierre-Michel Bataille
(74) *Attorney, Agent, or Firm* — Alpine Technology Law Group LLC

(57) ABSTRACT

Methods and apparatus related to a rotated planar XOR scheme for Varied-Sector-Size (VSS) enablement in flat indirection systems are described. In one embodiment, non-volatile memory stores user data in a first set of plurality of planes across a plurality of dies and parity data corresponding to the user data in a second set of plurality of planes. The user data in the first set of the plurality of planes across the plurality of dies and the second set of the plurality of planes is rotated to match a mapping of the parity data. Other embodiments are also disclosed and claimed.

26 Claims, 7 Drawing Sheets

(56) References Cited

U.S. PATENT DOCUMENTS

| | | | |
|---|---|---|---|
| 9,229,876 B2* | 1/2016 | Slepon | G06F 12/1009 |
| 9,354,973 B2 | 5/2016 | Wakchaure et al. | |
| 9,443,616 B2* | 9/2016 | Chen | G11C 29/26 |
| 2008/0313364 A1* | 12/2008 | Flynn | G06F 1/183 |
| | | | 710/31 |
| 2010/0199125 A1 | 8/2010 | Reche | |
| 2013/0326318 A1 | 12/2013 | Haswell | |
| 2014/0156966 A1 | 6/2014 | Ellis et al. | |
| 2014/0164881 A1 | 6/2014 | Chen et al. | |
| 2014/0237287 A1* | 8/2014 | Burd | G06F 11/1028 |
| | | | 714/6.24 |
| 2014/0281250 A1 | 9/2014 | Manohar et al. | |
| 2014/0281813 A1 | 9/2014 | Wakchaure et al. | |
| 2014/0351675 A1 | 11/2014 | Tiziani et al. | |
| 2015/0128010 A1* | 5/2015 | Ojalvo | G11C 7/1006 |
| | | | 714/768 |

OTHER PUBLICATIONS

Notice of Allowance received for U.S. Appl. No. 13/798,370, dated Feb. 1, 2016, 8 pages.
Office Action received for U.S. Appl. No. 13/798,370, dated Jul. 21, 2015, 13 pages.
Office Action received for U.S. Appl. No. 13/798,370, dated Jan. 5, 2015, 17 pages.
Office Action received for U.S. Appl. No. 13/798,370, dated Sep. 5, 2014, 16 pages.
International Preliminary Report on Patentability received for International Application No. PCT/US2016/018515, dated Oct. 12, 2017, 8 pages.

* cited by examiner

|  | die 0 | | | | die 1 | | | | die 2 | | | | die 3 | | | |
|  | plane0 | plane1 | plane2 | plane3 | plane0 | plane1 | plane2 | plane3 | plane0 | plane1 | plane2 | plane3 | plane0 | plane1 | plane2 | plane3 |
|---|---|---|---|---|---|---|---|---|---|---|---|---|---|---|---|---|
| stripe N | x0 | x1 | x2 | x3 | x0 | x1 | x2 | x3 | x0 | x1 | x2 | x3 | p0 | p1 | p2 | p3 |
| stripe N + 1 | x0 | x1 | x2 | x3 | x0 | x1 | x2 | x3 | x0 | x1 | x2 | x3 | p0 | p1 | p2 | p3 |
| stripe N + 2 | x0 | x1 | x2 | x3 | x0 | x1 | x2 | x3 | x0 | x1 | x2 | x3 | p0 | p1 | p2 | p3 |
| stripe N + 3 | x0 | x1 | x2 | x3 | x0 | x1 | x2 | x3 | x0 | x1 | x2 | x3 | p0 | p1 | p2 | p3 |

*FIG. 2A*

|  | die 0 | | | | die 1 | | | | die 2 | | | | die 3 | | | |
|  | plane0 | plane1 | plane2 | plane3 | plane0 | plane1 | plane2 | plane3 | plane0 | plane1 | plane2 | plane3 | plane0 | plane1 | plane2 | plane3 |
|---|---|---|---|---|---|---|---|---|---|---|---|---|---|---|---|---|
| stripe N | x0 | x0 | x0 | x0 | x0 | x0 | x0 | x0 | x0 | x0 | x0 | x0 | x0 | x0 | x0 | p0 |
| stripe N + 1 | x1 | x1 | x1 | x1 | x1 | x1 | x1 | x1 | x1 | x1 | x1 | x1 | x1 | x1 | x1 | p1 |
| stripe N + 2 | x2 | x2 | x2 | x2 | x2 | x2 | x2 | x2 | x2 | x2 | x2 | x2 | x2 | x2 | x2 | p2 |
| stripe N + 3 | x3 | x3 | x3 | x3 | x3 | x3 | x3 | x3 | x3 | x3 | x3 | x3 | x3 | x3 | x3 | p3 |

*FIG. 2B*

|  | die 0 | | | | die 1 | | | | die 2 | | | | die 3 | | | |
|  | plane0 | plane1 | plane2 | plane3 | plane0 | plane1 | plane2 | plane3 | plane0 | plane1 | plane2 | plane3 | plane0 | plane1 | plane2 | plane3 |
|---|---|---|---|---|---|---|---|---|---|---|---|---|---|---|---|---|
| stripe N | x0 | x0 | x0 | x0 | x0 | x0 | x0 | x0 | x0 | x0 | x0 | x0 | x0 | x0 | x0 | x0 |
| stripe N + 1 | x1 | x1 | x1 | x1 | x1 | x1 | x1 | x1 | x1 | x1 | x1 | x1 | x1 | x1 | x1 | x1 |
| stripe N + 2 | x2 | x2 | x2 | x2 | x2 | x2 | x2 | x2 | x2 | x2 | x2 | x2 | x2 | x2 | x2 | x2 |
| stripe N + 3 | x3 | x3 | x3 | x3 | x3 | x3 | x3 | x3 | x3 | x3 | x3 | x3 | p0 | p1 | p2 | p3 |

*FIG. 2C*

| | | stripe N | stripe N + 1 | stripe N + 2 | stripe N + 3 |
|---|---|---|---|---|---|
| die 0 | plane0 | x0 | x1 | x2 | x3 |
| | plane1 | x1 | x2 | x3 | x0 |
| | plane2 | x2 | x3 | x0 | x1 |
| | plane3 | x3 | x0 | x1 | x2 |
| die 1 | plane0 | x0 | x1 | x2 | x3 |
| | plane1 | x1 | x2 | x3 | x0 |
| | plane2 | x2 | x3 | x0 | x1 |
| | plane3 | x3 | x0 | x1 | x2 |
| die 2 | plane0 | x0 | x1 | x2 | x3 |
| | plane1 | x1 | x2 | x3 | x0 |
| | plane2 | x2 | x3 | x0 | x1 |
| | plane3 | x3 | x0 | x1 | x2 |
| die 3 | plane0 | x0 | x1 | x2 | p3 |
| | plane1 | x1 | x2 | x3 | p0 |
| | plane2 | x2 | x3 | x0 | p1 |
| | plane3 | x3 | x0 | x1 | p2 |

*FIG. 2D*

METHOD AND APPARATUS FOR IMPROVING IMMUNITY TO DEFECTS IN A NON-VOLATILE MEMORY

FIELD

The present disclosure generally relates to the field of electronics. More particularly, some embodiments generally relate to improving immunity to defects in non-volatile memory.

BACKGROUND

Parity checking can be used to address extrinsic defects and/or improve system reliability in storage devices. However, parity checking generally relies on stored data to determine whether some data is defective. As storage devices grow in size, the storage requirement for the corresponding parity data can significantly add to the requisite storage space. This additional space requirement can increase the manufacturing costs and may also slow down overall system performance, e.g., due to the additional time required to access the additional parity storage space.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

FIGS. 2A-2D illustrate storage configurations for user and parity data in planes across a plurality of dies, according to some embodiments.

DETAILED DESCRIPTION

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware, software, firmware, or some combination thereof.

As discussed above, parity checking can be used to address extrinsic defects and/or improve system reliability in storage devices (such as Solid State Drives (SSDs) that store data in non-volatile memory). XOR (Exclusive OR) based parity checking can be used to address extrinsic defects and improve system reliability in flash based SSDs. But, the flash space used to store the XOR parity data increases the Bill-Of-Materials (BOM) for SSDs. Furthermore, compared to a conventional XOR scheme, a planar XOR reduces the space usage overhead by utilizing the same XOR parity data for data stored across multiple planes in the same Integrated Circuit (IC) die. However, this scheme exposes the system to a risk of within-plane failure in a die (i.e., failure in the same NAND (and/or NOR) memory plane on the same die).

To this end, some embodiments relate to a rotated planar XOR scheme for Varied-Sector-Size (VSS) enablement in flat indirection systems. Moreover, an embodiment improves the system immunity to within-plane (e.g., NAND and/or NOR memory cell) defects for SSDs which use the planar XOR scheme. For example, one embodiment makes the system immune to (or at least reduces the likelihood of) XOR recovery failure due to the within-plane defects by rotating the stored data to XOR parity mapping. This in turn addresses issues posed by some known planar XOR solutions which are not immune to multiple read errors in the same NAND (and/or NOR) memory plane on the same die.

Furthermore, even though some embodiments are discussed with reference to defect detection in SSDs (e.g., including NAND and/or NOR type of memory cells), embodiments are not limited to SSDs and may be used for other types of non-volatile storage devices including, for example, one or more of: nanowire memory, Ferro-electric transistor random access memory (FeTRAM), magnetoresistive random access memory (MRAM), flash memory, Spin Torque Transfer Random Access Memory (STTRAM), Resistive Random Access Memory, byte addressable 3-Dimensional Cross Point Memory, PCM (Phase Change Memory), etc.

Figure 1:
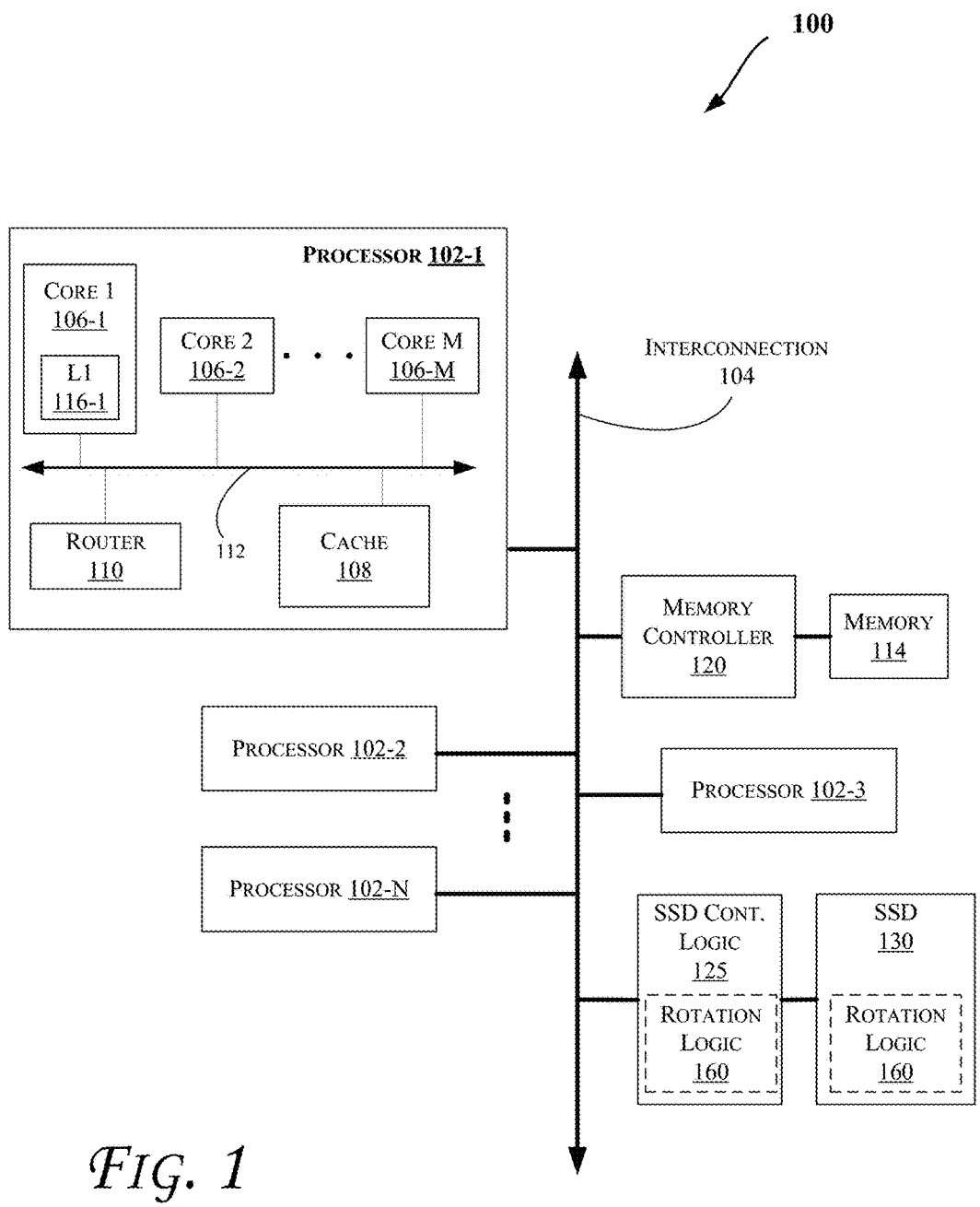
FIGS. 1 and 4-6 illustrate block diagrams of embodiments of computing systems, which may be utilized to implement various embodiments discussed herein.

The techniques discussed herein may be provided in various computing systems (e.g., including a non-mobile computing device such as a desktop, workstation, server, rack system, etc. and a mobile computing device such as a smartphone, tablet, UMPC (Ultra-Mobile Personal Computer), laptop computer, Ultrabook™ computing device, smart watch, smart glasses, smart bracelet, etc.), including those discussed with reference to FIGS. 1-6. More particularly, FIG. 1 illustrates a block diagram of a computing system 100, according to an embodiment. The system 100 may include one or more processors 102-1 through 102-N (generally referred to herein as "processors 102" or "processor 102"). The processors 102 may communicate via an interconnection or bus 104. Each processor may include various components some of which are only discussed with reference to processor 102-1 for clarity. Accordingly, each of the remaining processors 102-2 through 102-N may include the same or similar components discussed with reference to the processor 102-1.

In an embodiment, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), logic 120, memory controllers (such as those discussed with reference to FIGS. 4-6), or other components.

In one embodiment, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that are utilized by one or more components of the processor 102-1, such as the cores 106. For example, the cache 108 may locally cache data stored in a memory 114 for faster access by the components of the processor 102. As shown in FIG. 1, the memory 114 may be in communication with the processors 102 via the interconnection 104. In an embodiment, the cache 108 (that may be shared) may have various levels, for example, the cache 108 may be a mid-level cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 1, memory 114 may be coupled to other components of system 100 through a memory controller 120. Memory 114 includes volatile memory and may be interchangeably referred to as main memory. Even though the memory controller 120 is shown to be coupled between the interconnection 104 and the memory 114, the memory controller 120 may be located elsewhere in system 100. For example, memory controller 120 or portions of it may be provided within one of the processors 102 in some embodiments.

System 100 may also include Non-Volatile (NV) storage device such as an SSD 130 coupled to the interconnect 104 via SSD controller logic 125. Hence, logic 125 may control access by various components of system 100 to the SSD 130. Furthermore, even though logic 125 is shown to be directly coupled to the interconnection 104 in FIG. 1, logic 125 can alternatively communicate via a storage bus/interconnect (such as the SATA (Serial Advanced Technology Attachment) bus, Peripheral Component Interconnect (PCI) (or PCI express (PCIe) interface), etc.) with one or more other components of system 100 (for example where the storage bus is coupled to interconnect 104 via some other logic like a bus bridge, chipset (such as discussed with reference to FIGS. 4-6), etc.). Additionally, logic 125 may be incorporated into memory controller logic (such as those discussed with reference to FIGS. 1 and 4-6) or provided on a same Integrated Circuit (IC) device in various embodiments (e.g., on the same IC device as the SSD 130 or in the same enclosure as the SSD 130).

Furthermore, logic 125 and/or SSD 130 may be coupled to one or more sensors (not shown) to receive information (e.g., in the form of one or more bits or signals) to indicate the status of or values detected by the one or more sensors. These sensor(s) may be provided proximate to components of system 100 (or other computing systems discussed herein such as those discussed with reference to other figures including 4-6, for example), including the cores 106, interconnections 104 or 112, components outside of the processor 102, SSD 130, SSD bus, SATA bus, logic 125, logic 160, etc., to sense variations in various factors affecting power/thermal behavior of the system/platform, such as temperature, operating frequency, operating voltage, power consumption, and/or inter-core communication activity, etc.

As illustrated in FIG. 1, SSD 130 may include rotation logic 160, which may be in the same enclosure as the SSD 130 and/or fully integrated on a Printed Circuit Board (PCB) of the SSD 130. Logic 160 facilitates a rotated planar XOR scheme for Varied-Sector-Size (VSS) enablement in flat indirection systems as discussed herein, e.g., with reference to FIGS. 2A-6.

More particularly, FIG. 2A shows the user data and XOR parity mapping for conventional XOR scheme. User data is marked with x'n', and XOR parity is marked with p'n', which is the XOR of all the data marked with x'n'. Conventional XOR has the dedicated XOR parity (e.g., on die 3) for each plane in a stripe across all the dies (e.g., for dies 0 to 2). Thus, it is not only immune to the cross-plane failure in the same die, but also to the within-plane defects in the same die, e.g. multiple read errors in die 0 plane 0. However, conventional XOR has high overhead on the NAND (which may be interchangeable with NOR herein) BOM since a dedicated XOR die (e.g., die 3 of FIG. 2A) is needed.

FIG. 2A shows a conventional XOR scheme. More particularly, in order to reduce the NAND space overhead, the same XOR parity is shared across planes in the same stripe and same die, as shown in FIG. 2B (where p0 in plane 3 of die 3 is shared for user data x0, stripe N across dies 0 to 3). The XOR BOM cost is effectively reduced from a full die to a quarter die (i.e., FIG. 2A vs. FIG. 2B). As discussed herein, each NAND device (e.g., SSD) may include one or more NAND die (e.g., die 0 to 3 shown in the example of FIG. 2A). A "stripe" generally refers to a unit of data (e.g., a word, a long word, etc.) that is split/stored in multiple die (e.g., stripe N is stored in die 0, die 1, die 2, and die 3 in the example of FIG. 2A). Each die is generally divided or partitioned into a plurality of planes (e.g., die 0 is divided into planes 0 through 3 in the example of FIG. 2A). Each die may store data in a minimum of a "page" granularity in each plane (e.g., labeled as x0, x1, x2, x3, p0, p1, p2, and p3 in the example of FIG. 2A). But, in a flat indirection system (e.g., used in an indirection system for enterprise SSDs), if the minimum atomic write granularity cannot be aligned to the NAND page, which is the program granularity in NAND flash, the scheme shown in FIG. 2B could cause write after write. For example, if the minimum atomic write granularity is four NAND pages, the existing of p0 page in die 3 will force the atomic write straddle to the first page in next stripe, which in turn will make all subsequent writes mis-aligned. Thus, all the dies on stripe N+1 will receive two NAND program commands, i.e. write after write, since they belong to the different atomic write granularity. The write after write operations degrades the drive performance. FIG. 2C is showing an improved variation of planar XOR which no longer has the problem of write after write. But, parity data is overlapped to its covered user data in the same plane of XOR die. This could cause the XOR recovery failure if the within-plane NAND defects are encountered in the XOR die (die 3 in this example).

To this end, an embodiment provides a rotated planar XOR, which elegantly resolves above problems (e.g., discussed with reference to FIGS. 2A to 2C) by rotating the user data and its XOR parity mapping across planes, as shown in FIG. 2D. In one embodiment, the rotation discussed with reference to FIG. 2D is performed (or caused to be performed) by logic 160. The four consecutive NAND pages in a specific plane of a NAND die are all with different XOR parity. Thus, this scheme is completely immune to the within-plane NAND defects in a die. Such embodiments provide a more robust XOR protection compared to the existing planar XOR implementation, as shown in FIG. 2C.

Another advantage of the rotated planar XOR scheme is its compatibility with Varied-Sector-Size (VSS) and Non-VSS in flat indirection system. Flat indirection requires the indirection unit to be aligned to the atomic write granularity. With the scheme shown in the FIG. 2D, both user data and XOR parity data can be dispatched in the granularity of quad-plane NAND pages, which is aligned to the flat indirection unit for both VSS and Non-VSS. Rotate XOR scheme is also compatible with both Erase Block (minimum erase granularity in NAND or "EB") and page level defect managements as long as the defect retirement is with quad-plane (e.g., planes p0, p1, p2, and p3 shown in FIGS. 2A-2D) granularity. Quad-plane page retire or quad-plane EB retire does not change the user data and XOR instance mapping shown in FIG. 2D.

Figure 3:
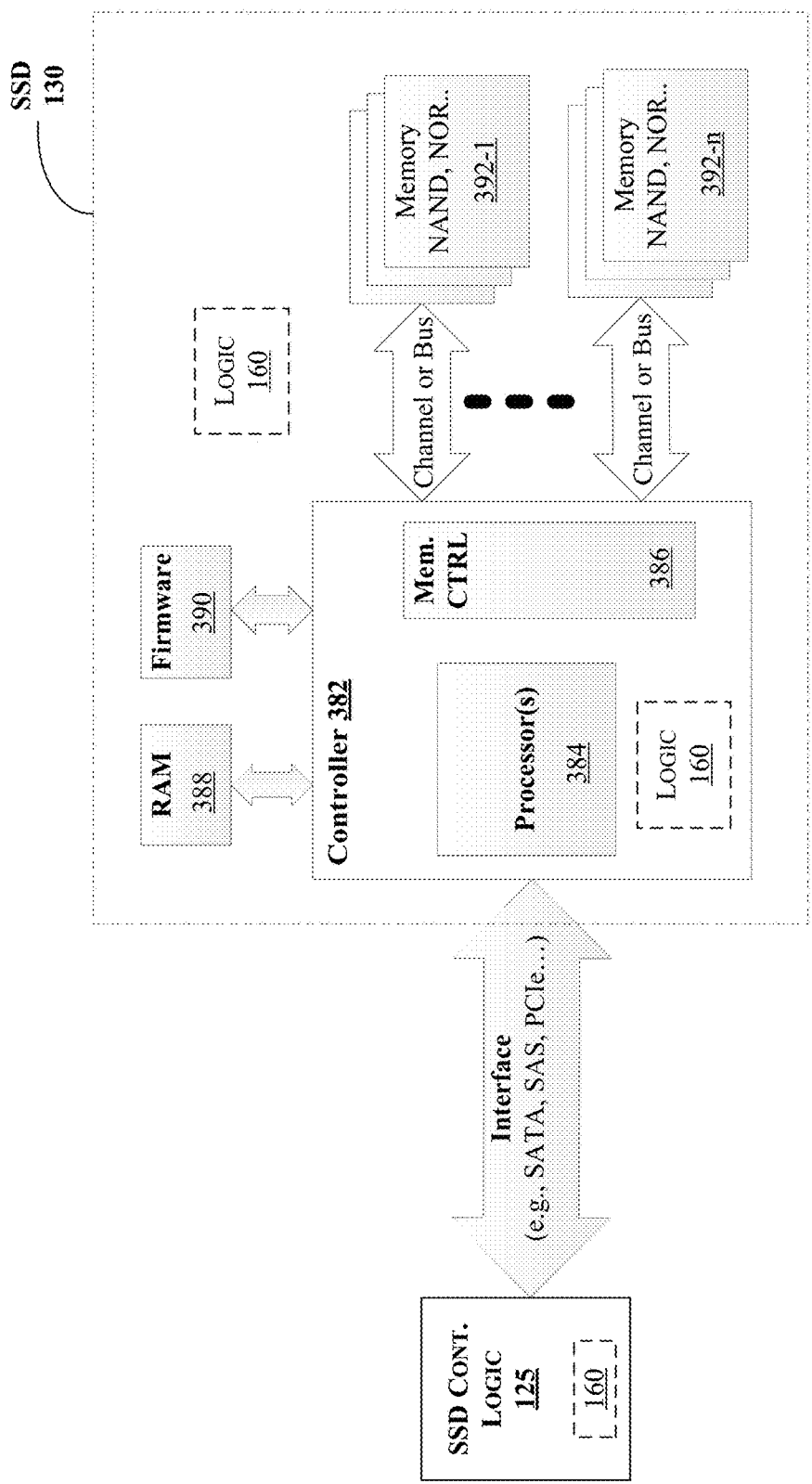
FIG. 3 illustrates a block diagram of various components of a solid state drive, according to an embodiment.

FIG. 3 illustrates a block diagram of various components of an SSD, according to an embodiment. Logic 160 may be located in various locations such as inside the SSD or SSD controller logic, e.g., such as illustrated in FIG. 3. SSD 130 includes a controller logic 382 (which in turn includes one or more processor cores or processors 384 and memory controller logic 386), Random Access Memory (RAM) 388, firmware storage 390, and one or more memory modules or dies 392-1 to 392-n (which may include NAND flash, NOR flash, or other types of non-volatile memory, such as the dies discussed with reference to FIGS. 2A-2D). Memory modules 392-1 to 392-n are coupled to the memory controller logic 386 via one or more memory channels or busses. Also, SSD 130 communicates with logic 125 via an interface (such as a SATA, SAS, PCIe (Peripheral Component Interconnect express), etc. interface). One or more of the operations discussed with reference to FIGS. 1-6 may be performed by one or more of the components of FIG. 3, e.g., processors 384 and/or controller 382 may compress/decompress (or otherwise cause compression/decompression) of data written to or read from memory modules 392-1 to 392-n. Also, one or more of the operations of FIGS. 1-6 may be programmed into the firmware 390. Further, controller 382 may include logic 160.

Figure 4:
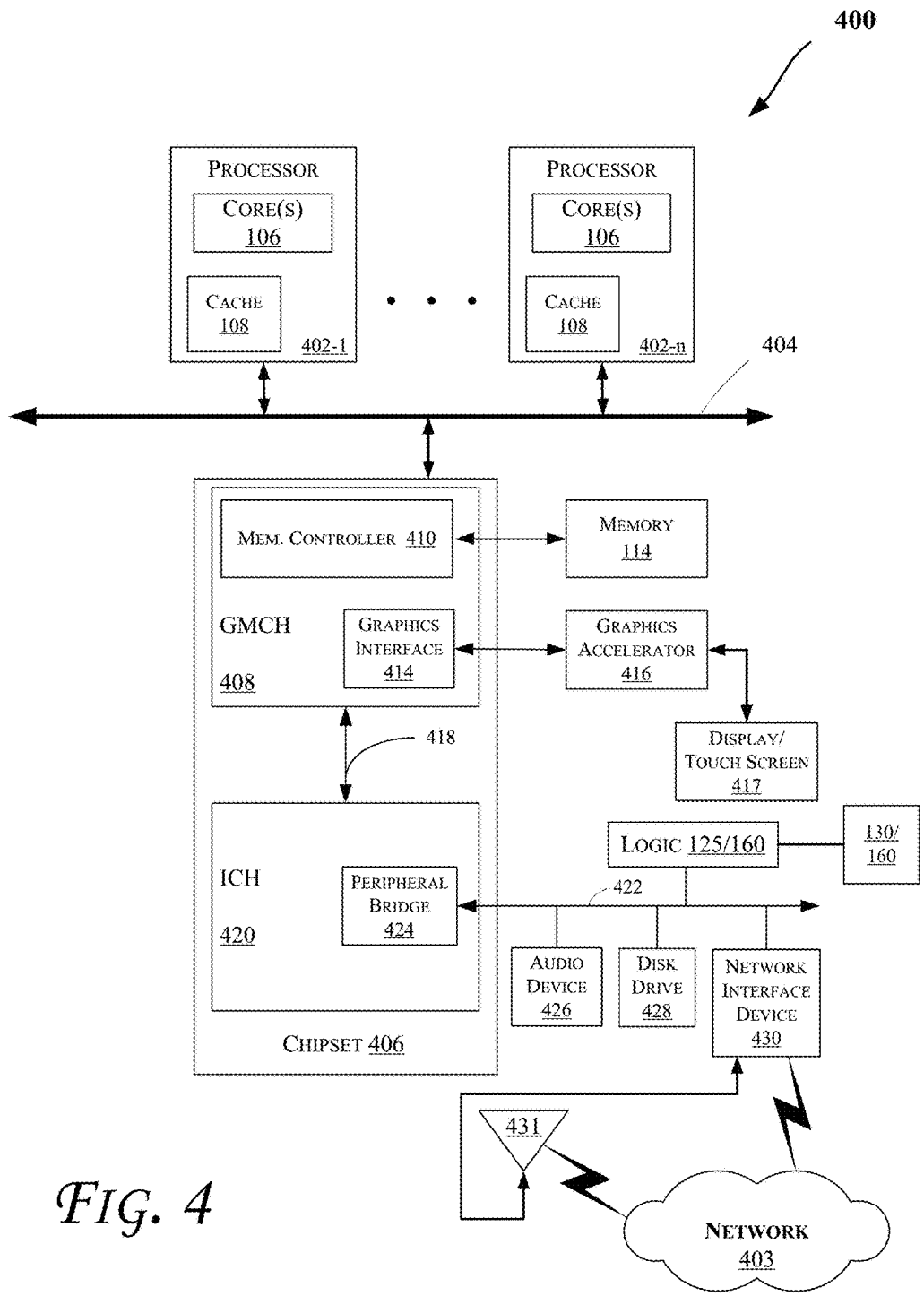

FIG. 4 illustrates a block diagram of a computing system 400 in accordance with an embodiment. The computing system 400 may include one or more central processing unit(s) (CPUs) 402 or processors that communicate via an interconnection network (or bus) 404. The processors 402 may include a general purpose processor, a network processor (that processes data communicated over a computer network 403), an application processor (such as those used in cell phones, smart phones, etc.), or other types of a processor (including a reduced instruction set computer (RISC) processor or a complex instruction set computer (CISC)). Various types of computer networks 403 may be utilized including wired (e.g., Ethernet, Gigabit, Fiber, etc.) or wireless networks (such as cellular, 3G (Third-Generation Cell-Phone Technology or 3rd Generation Wireless Format (UWCC)), 4G, Low Power Embedded (LPE), etc.). Moreover, the processors 402 may have a single or multiple core design. The processors 402 with a multiple core design may integrate different types of processor cores on the same integrated circuit (IC) die. Also, the processors 402 with a multiple core design may be implemented as symmetrical or asymmetrical multiprocessors.

In an embodiment, one or more of the processors 402 may be the same or similar to the processors 102 of FIG. 1. For example, one or more of the processors 402 may include one or more of the cores 106 and/or cache 108. Also, the operations discussed with reference to FIGS. 1-3 may be performed by one or more components of the system 400.

A chipset 406 may also communicate with the interconnection network 404. The chipset 406 may include a graphics and memory control hub (GMCH) 408. The GMCH 408 may include a memory controller 410 (which may be the same or similar to the memory controller 120 of FIG. 1 in an embodiment) that communicates with the memory 114. The memory 114 may store data, including sequences of instructions that are executed by the CPU 402, or any other device included in the computing system 400. Also, system 400 includes logic 125, SSD 130, and/or logic 160 (which may be coupled to system 400 via bus 422 as illustrated, via other interconnects such as 404, where logic 125 is incorporated into chipset 406, etc. in various embodiments). In one embodiment, the memory 114 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk drive, flash, etc., including any NVM discussed herein. Additional devices may communicate via the interconnection network 404, such as multiple CPUs and/or multiple system memories.

The GMCH 408 may also include a graphics interface 414 that communicates with a graphics accelerator 416. In one embodiment, the graphics interface 414 may communicate with the graphics accelerator 416 via an accelerated graphics port (AGP) or Peripheral Component Interconnect (PCI) (or PCI express (PCIe) interface). In an embodiment, a display 417 (such as a flat panel display, touch screen, etc.) may communicate with the graphics interface 414 through, for example, a signal converter that translates a digital representation of an image stored in a storage device such as video memory or system memory into display signals that are interpreted and displayed by the display. The display signals produced by the display device may pass through various control devices before being interpreted by and subsequently displayed on the display 417.

A hub interface 418 may allow the GMCH 408 and an input/output control hub (ICH) 420 to communicate. The ICH 420 may provide an interface to I/O devices that communicate with the computing system 400. The ICH 420 may communicate with a bus 422 through a peripheral bridge (or controller) 424, such as a peripheral component interconnect (PCI) bridge, a universal serial bus (USB) controller, or other types of peripheral bridges or controllers. The bridge 424 may provide a data path between the CPU 402 and peripheral devices. Other types of topologies may be utilized. Also, multiple buses may communicate with the ICH 420, e.g., through multiple bridges or controllers. Moreover, other peripherals in communication with the ICH 420 may include, in various embodiments, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 422 may communicate with an audio device 426, one or more disk drive(s) 428, and a network interface device 430 (which is in communication with the computer network 403, e.g., via a wired or wireless interface). As shown, the network interface device 430 may be coupled to an antenna 431 to wirelessly (e.g., via an Institute of Electrical and Electronics Engineers (IEEE) 802.11 interface (including IEEE 802.11a/b/g/n/ac, etc.), cellular interface, 3G, 4G, LPE, etc.) communicate with the network 403. Other devices may communicate via the bus 422. Also, various components (such as the network interface device 430) may communicate with the GMCH 408 in some embodiments. In addition, the processor 402 and the GMCH 408 may be combined to form a single chip. Furthermore, the graphics accelerator 416 may be included within the GMCH 408 in other embodiments.

Furthermore, the computing system 400 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 428), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 5:
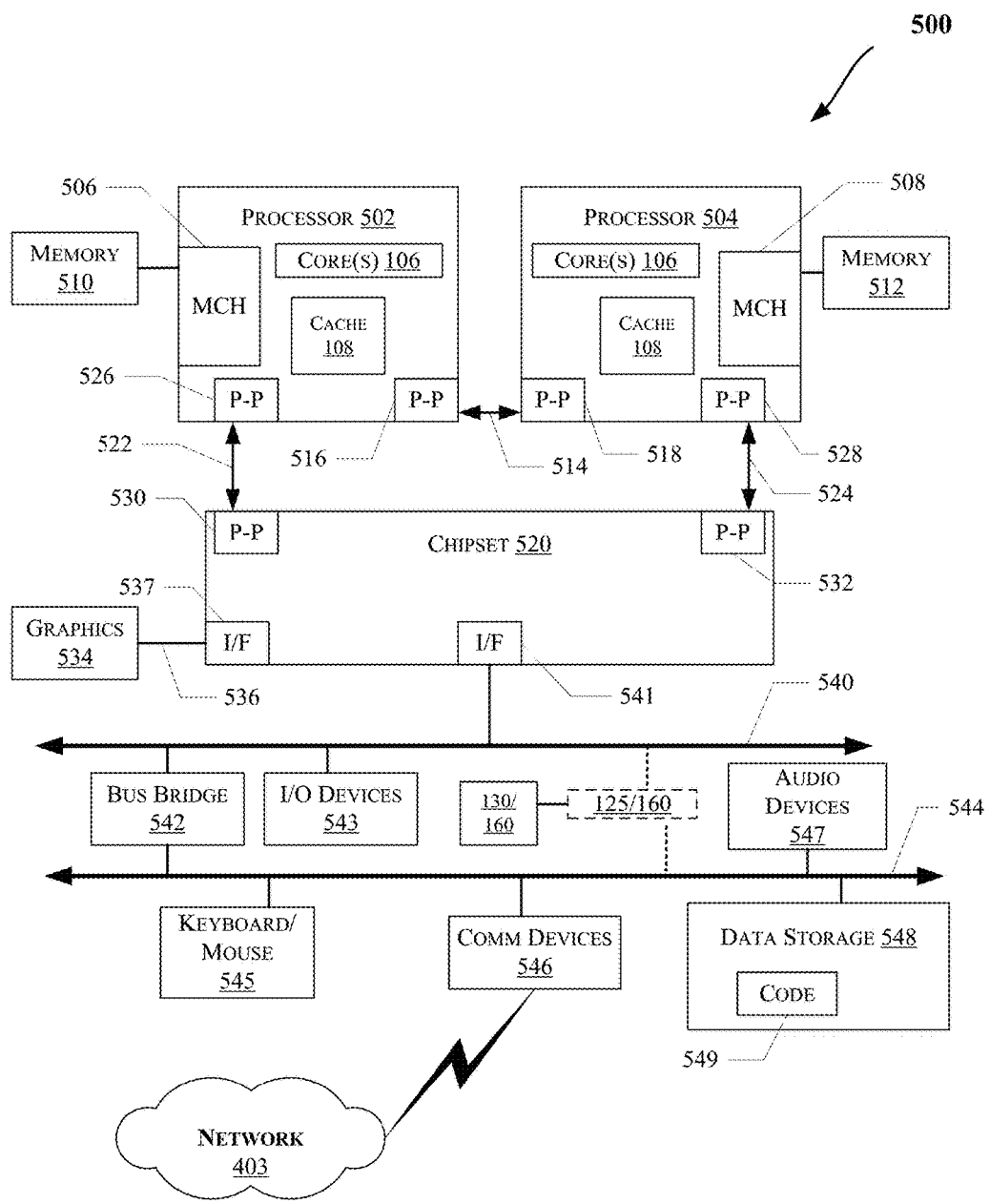

FIG. 5 illustrates a computing system 500 that is arranged in a point-to-point (PtP) configuration, according to an embodiment. In particular, FIG. 5 shows a system where processors, memory, and input/output devices are interconnected by a number of point-to-point interfaces. The operations discussed with reference to FIGS. 1-4 may be performed by one or more components of the system 500.

As illustrated in FIG. 5, the system 500 may include several processors, of which only two, processors 502 and 504 are shown for clarity. The processors 502 and 504 may each include a local memory controller hub (MCH) 506 and 508 to enable communication with memories 510 and 512. The memories 510 and/or 512 may store various data such as those discussed with reference to the memory 114 of FIGS. 1 and/or 4. Also, MCH 506 and 508 may include the memory controller 120 in some embodiments. Furthermore, system 500 includes logic 125, SSD 130, and/or logic 160 (which may be coupled to system 500 via bus 540/544 such as illustrated, via other point-to-point connections to the processor(s) 502/504 or chipset 520, where logic 125 is incorporated into chipset 520, etc. in various embodiments).

In an embodiment, the processors 502 and 504 may be one of the processors 402 discussed with reference to FIG. 4. The processors 502 and 504 may exchange data via a point-to-point (PtP) interface 514 using PtP interface circuits 516 and 518, respectively. Also, the processors 502 and 504 may each exchange data with a chipset 520 via individual PtP interfaces 522 and 524 using point-to-point interface circuits 526, 528, 530, and 532. The chipset 520 may further exchange data with a high-performance graphics circuit 534 via a high-performance graphics interface 536, e.g., using a PtP interface circuit 537. As discussed with reference to FIG. 4, the graphics interface 536 may be coupled to a display device (e.g., display 417) in some embodiments.

As shown in FIG. 5, one or more of the cores 106 and/or cache 108 of FIG. 1 may be located within the processors 502 and 504. Other embodiments, however, may exist in other circuits, logic units, or devices within the system 500 of FIG. 5. Furthermore, other embodiments may be distributed throughout several circuits, logic units, or devices illustrated in FIG. 5.

The chipset 520 may communicate with a bus 540 using a PtP interface circuit 541. The bus 540 may have one or more devices that communicate with it, such as a bus bridge 542 and I/O devices 543. Via a bus 544, the bus bridge 542 may communicate with other devices such as a keyboard/mouse 545, communication devices 546 (such as modems, network interface devices, or other communication devices that may communicate with the computer network 403, as discussed with reference to network interface device 430 for example, including via antenna 431), audio I/O device, and/or a data storage device 548. The data storage device 548 may store code 549 that may be executed by the processors 502 and/or 504.

Figure 6:
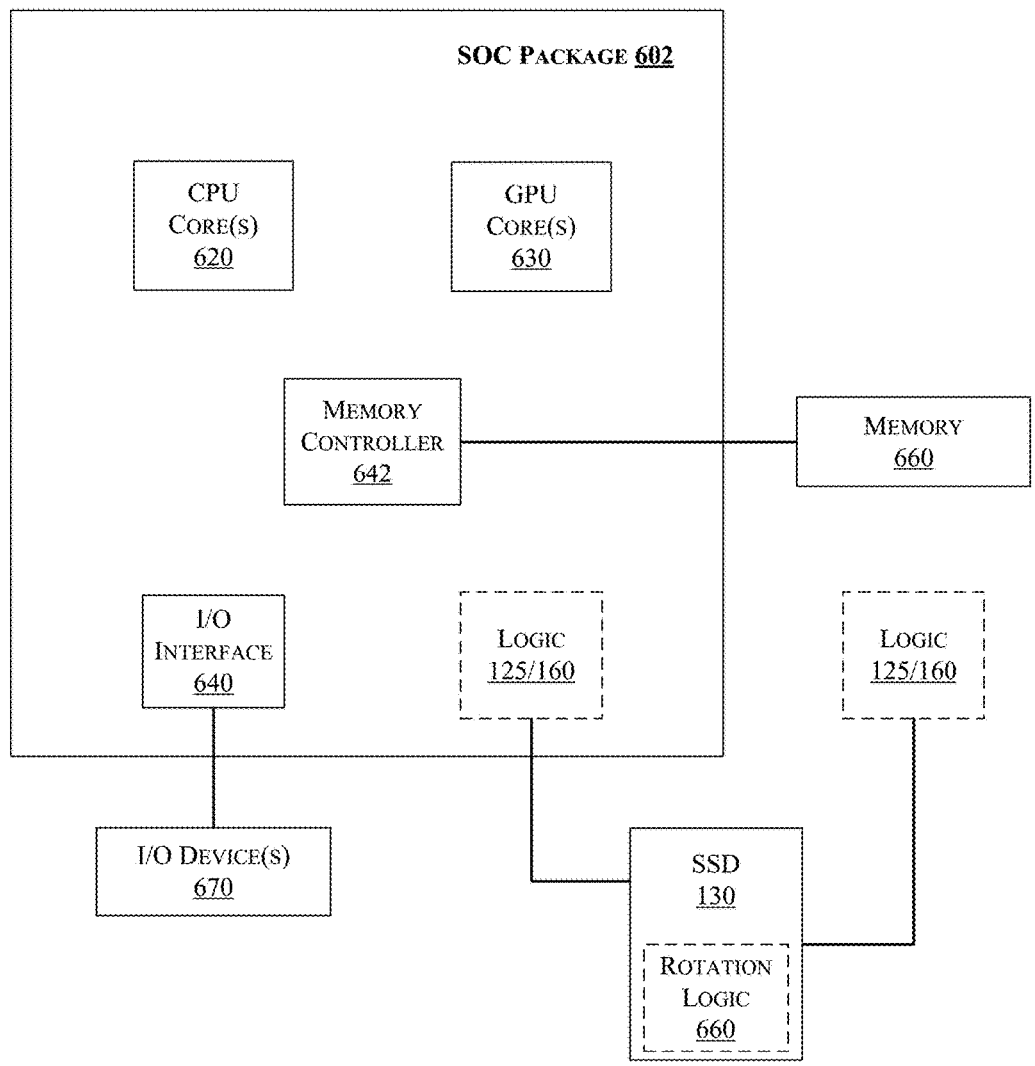

In some embodiments, one or more of the components discussed herein can be embodied as a System On Chip (SOC) device. FIG. 6 illustrates a block diagram of an SOC package in accordance with an embodiment. As illustrated in FIG. 6, SOC 602 includes one or more Central Processing Unit (CPU) cores 620, one or more Graphics Processor Unit (GPU) cores 630, an Input/Output (I/O) interface 640, and a memory controller 642. Various components of the SOC package 602 may be coupled to an interconnect or bus such as discussed herein with reference to the other figures. Also, the SOC package 602 may include more or less components, such as those discussed herein with reference to the other figures. Further, each component of the SOC package 620 may include one or more other components, e.g., as discussed with reference to the other figures herein. In one embodiment, SOC package 602 (and its components) is provided on one or more Integrated Circuit (IC) die, e.g., which are packaged onto a single semiconductor device.

As illustrated in FIG. 6, SOC package 602 is coupled to a memory 660 (which may be similar to or the same as memory discussed herein with reference to the other figures) via the memory controller 642. In an embodiment, the memory 660 (or a portion of it) can be integrated on the SOC package 602.

The I/O interface 640 may be coupled to one or more I/O devices 670, e.g., via an interconnect and/or bus such as discussed herein with reference to other figures. I/O device(s) 670 may include one or more of a keyboard, a mouse, a touchpad, a display, an image/video capture device (such as a camera or camcorder/video recorder), a touch screen, a speaker, or the like. Furthermore, SOC package 602 may include/integrate the logic 125 in an embodiment. Alternatively, the logic 125 may be provided outside of the SOC package 602 (i.e., as a discrete logic).

The following examples pertain to further embodiments. Example 1 includes 1 includes an apparatus comprising: non-volatile memory to store user data in a first set of plurality of planes across a plurality of dies and parity data corresponding to the user data in a second set of plurality of planes; and logic to rotate the user data in the first set of the plurality of planes across the plurality of dies and the second set of the plurality of planes to match a mapping of the parity data. Example 2 includes the apparatus of example 1, wherein the logic is to rotate the user data to match the mapping of the parity data by causing a plurality of pages of the user data and a page of the parity data to be stored in a first plane of the second set of the plurality of planes. Example 3 includes the apparatus of example 2, wherein the page of the parity data is to correspond to a different page of the user data than the plurality of the pages of the user data. Example 4 includes the apparatus of example 1, wherein the first set of the plurality of planes and the second set of the plurality of planes are to at least partially overlap in one of the plurality of dies. Example 5 includes the apparatus of example 1, wherein the second set of the plurality of planes is in one of the plurality of dies. Example 6 includes the apparatus of example 1, wherein the logic is to rotate the user data to match the mapping of the parity data to support a Varied-Sector-Size (VSS) implementation or a Non-VSS implementation in a flat indirection system. Example 7 includes the apparatus of example 1, wherein the non-volatile memory, the logic, and a Solid State Drive (SSD) are on a same integrated circuit device. Example 8 includes the apparatus of example 1, wherein the non-volatile memory is to comprise one of: nanowire memory, Ferro-electric transistor random access memory (FeTRAM), magnetoresistive random access memory (MRAM), flash memory, Spin Torque Transfer Random Access Memory (STTRAM), Resistive Random Access Memory, Phase Change Memory (PCM), and byte addressable 3-Dimensional Cross Point Memory. Example 9 includes the apparatus of example 1, wherein an SSD is to comprise the non-volatile memory and the logic.

Example 10 includes a method comprising: storing, in non-volatile memory, user data in a first set of plurality of planes across a plurality of dies and parity data corresponding to the user data in a second set of plurality of planes; and rotating the user data in the first set of the plurality of planes across the plurality of dies and the second set of the plurality of planes to match a mapping of the parity data. Example 11 includes the method of example 10, further comprising rotating the user data to match the mapping of the parity data by causing a plurality of pages of the user data and a page of the parity data to be stored in a first plane of the second set of the plurality of planes. Example 12 includes the method of example 11, wherein the page of the parity data is to correspond to a different page of the user data than the plurality of the pages of the user data. Example 13 includes the method of example 10, further comprising at least partially overlapping the first set of the plurality of planes and the second set of the plurality of planes in one of the plurality of dies. Example 14 includes the method of example 10, wherein the second set of the plurality of planes is in one of the plurality of dies. Example 15 includes the method of example 10, further comprising to rotating the user data to match the mapping of the parity data to support a Varied-Sector-Size (VSS) implementation or a Non-VSS implementation in a flat indirection system. Example 16 includes the method of example 10, wherein the non-volatile memory comprises one of: nanowire memory, Ferro-electric transistor random access memory (FeTRAM), magnetoresistive random access memory (MRAM), flash memory, Spin Torque Transfer Random Access Memory (STTRAM), Resistive Random Access Memory, Phase Change Memory (PCM), and byte addressable 3-Dimensional Cross Point Memory.

Example 17 includes a system comprising: non-volatile memory; and at least one processor core to access the non-volatile memory; the non-volatile memory to store user data in a first set of plurality of planes across a plurality of dies and parity data corresponding to the user data in a second set of plurality of planes; and logic to rotate the user data in the first set of the plurality of planes across the plurality of dies and the second set of the plurality of planes to match a mapping of the parity data. Example 18 includes the system of example 17, wherein the logic is to rotate the user data to match the mapping of the parity data by causing a plurality of pages of the user data and a page of the parity data to be stored in a first plane of the second set of the plurality of planes. Example 19 includes the system of example 18, wherein the page of the parity data is to correspond to a different page of the user data than the plurality of the pages of the user data. Example 20 includes the system of example 17, wherein the first set of the plurality of planes and the second set of the plurality of planes are to at least partially overlap in one of the plurality of dies. Example 21 includes the system of example 17, wherein the second set of the plurality of planes is in one of the plurality of dies. Example 22 includes the system of example 17, wherein the logic is to rotate the user data to match the mapping of the parity data to support a Varied-Sector-Size (VSS) implementation or a Non-VSS implementation in a flat indirection system. Example 23 includes the system of example 17, wherein the non-volatile memory, the logic, and a Solid State Drive (SSD) are on a same integrated circuit device. Example 24 includes the system of example 17, wherein the non-volatile memory is to comprise one of: nanowire memory, Ferro-electric transistor random access memory (FeTRAM), magnetoresistive random access memory (MRAM), flash memory, Spin Torque Transfer Random Access Memory (STTRAM), Resistive Random Access Memory, Phase Change Memory (PCM), and byte addressable 3-Dimensional Cross Point Memory. Example 25 includes the system of example 17, wherein an SSD is to comprise the non-volatile memory and the logic.

Example 26 includes a computer-readable medium comprising one or more instructions that when executed on a processor configure the processor to perform one or more operations to: store, in non-volatile memory, user data in a first set of plurality of planes across a plurality of dies and parity data corresponding to the user data in a second set of plurality of planes; and rotate the user data in the first set of the plurality of planes across the plurality of dies and the second set of the plurality of planes to match a mapping of the parity data. Example 27 includes the computer-readable medium of example 26, further comprising one or more instructions that when executed on the processor configure the processor to perform one or more operations to rotate the user data to match the mapping of the parity data by causing a plurality of pages of the user data and a page of the parity data to be stored in a first plane of the second set of the plurality of planes. Example 28 includes the computer-readable medium of example 26, further comprising one or more instructions that when executed on the processor configure the processor to perform one or more operations to at least partially overlapping the first set of the plurality of planes and the second set of the plurality of planes in one of the plurality of dies.

Example 29 includes an apparatus comprising means to perform a method as set forth in any preceding example.

Example 30 includes machine-readable storage including machine-readable instructions, when executed, to implement a method or realize an apparatus as set forth in any preceding example.

In various embodiments, the operations discussed herein, e.g., with reference to FIGS. 1-6, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed with respect to FIGS. 1-6.

Additionally, such tangible computer-readable media may be downloaded as a computer program product, wherein the program may be transferred from a remote computer (e.g., a server) to a requesting computer (e.g., a client) by way of data signals (such as in a carrier wave or other propagation medium) via a communication link (e.g., a bus, a modem, or a network connection).

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus comprising:
   non-volatile memory to store user data in a first set of plurality of planes across a plurality of dies and parity data corresponding to the user data in a second set of plurality of planes; and
   logic to rotate the user data in the first set of the plurality of planes across the plurality of dies and the second set of the plurality of planes to match a mapping of the parity data, wherein both the user data and the parity data are to be dispatched in a granularity of quad-plane pages, wherein the quad-plane pages are to be aligned to a flat indirection unit for Varied-Sector-Size (VSS) or Non-VSS implementations.

2. The apparatus of claim 1, wherein the logic is to rotate the user data to match the mapping of the parity data by causing a plurality of pages of the user data and a page of the parity data to be stored in a first plane of the second set of the plurality of planes.

3. The apparatus of claim 2, wherein the page of the parity data is to correspond to a different page of the user data than the plurality of the pages of the user data.

4. The apparatus of claim 1, wherein the first set of the plurality of planes and the second set of the plurality of planes are to at least partially overlap in one of the plurality of dies.

5. The apparatus of claim 1, wherein the second set of the plurality of planes is in one of the plurality of dies.

6. The apparatus of claim 1, wherein the logic is to rotate the user data to match the mapping of the parity data to support a Varied-Sector-Size (VSS) implementation or a Non-VSS implementation in a flat indirection system.

7. The apparatus of claim 1, wherein the non-volatile memory, the logic, and a Solid State Drive (SSD) are on a same integrated circuit device.

8. The apparatus of claim 1, wherein the non-volatile memory is to comprise one of: Ferro-electric transistor random access memory (FeTRAM), magnetoresistive random access memory (MRAM), Phase Change Memory (PCM), or flash memory.

9. The apparatus of claim 1, wherein an SSD is to comprise the non-volatile memory and the logic.

10. The apparatus of claim 1, wherein the non-volatile memory is to comprise one of: nanowire memory, Spin Torque Transfer Random Access Memory (STTRAM), Resistive Random Access Memory, and byte addressable 3-Dimensional Cross Point Memory.

11. A system comprising:
    non-volatile memory; and
    at least one processor core to access the non-volatile memory;
    the non-volatile memory to store user data in a first set of plurality of planes across a plurality of dies and parity data corresponding to the user data in a second set of plurality of planes; and
    logic to rotate the user data in the first set of the plurality of planes across the plurality of dies and the second set of the plurality of planes to match a mapping of the parity data, wherein both the user data and the parity data are to be dispatched in a granularity of quad-plane pages, wherein the quad-plane pages are to be aligned to a flat indirection unit for Varied-Sector-Size (VSS) or Non-VSS implementations.

12. The system of claim 11, wherein the logic is to rotate the user data to match the mapping of the parity data by causing a plurality of pages of the user data and a page of the parity data to be stored in a first plane of the second set of the plurality of planes.

13. The system of claim 12, wherein the page of the parity data is to correspond to a different page of the user data than the plurality of the pages of the user data.

14. The system of claim 11, wherein the first set of the plurality of planes and the second set of the plurality of planes are to at least partially overlap in one of the plurality of dies.

15. The system of claim 11, wherein the second set of the plurality of planes is in one of the plurality of dies.

16. The system of claim 11, wherein the logic is to rotate the user data to match the mapping of the parity data to support a Varied-Sector-Size (VSS) implementation or a Non-VSS implementation in a flat indirection system.

17. The system of claim 11, wherein the non-volatile memory, the logic, and a Solid State Drive (SSD) are on a same integrated circuit device.

18. The system of claim 11, wherein the non-volatile memory is to comprise one of: Ferro-electric transistor random access memory (FeTRAM), magnetoresistive random access memory (MRAM), Phase Change Memory (PCM), or flash memory.

19. The system of claim 11, wherein an SSD is to comprise the non-volatile memory and the logic.

20. A method comprising:
    storing, in non-volatile memory, user data in a first set of plurality of planes across a plurality of dies and parity data corresponding to the user data in a second set of plurality of planes; and
    rotating the user data in the first set of the plurality of planes across the plurality of dies and the second set of the plurality of planes to match a mapping of the parity data, wherein both the user data and the parity data are dispatched in a granularity of quad-plane pages, wherein the quad-plane pages are aligned to a flat indirection unit for Varied-Sector-Size (VSS) or Non-VSS implementations.

21. The method of claim 20, further comprising rotating the user data to match the mapping of the parity data by causing a plurality of pages of the user data and a page of the parity data to be stored in a first plane of the second set of the plurality of planes.

22. The method of claim 21, wherein the page of the parity data is to correspond to a different page of the user data than the plurality of the pages of the user data.

23. The method of claim 20, further comprising at least partially overlapping the first set of the plurality of planes and the second set of the plurality of planes in one of the plurality of dies.

24. The method of claim 20, wherein the second set of the plurality of planes is in one of the plurality of dies.

25. The method of claim 20, further comprising to rotating the user data to match the mapping of the parity data to support a Varied-Sector-Size (VSS) implementation or a Non-VSS implementation in a flat indirection system.

26. The method of claim 20, wherein the non-volatile memory comprises one of: Ferro-electric transistor random access memory (FeTRAM), magnetoresistive random access memory (MRAM), Phase Change Memory (PCM), or flash memory.

* * * * *